(12) United States Patent
Thomas et al.

(10) Patent No.: US 8,971,413 B2
(45) Date of Patent: Mar. 3, 2015

(54) TECHNIQUES FOR STORING AND RETRIEVING PIXEL DATA

(75) Inventors: Vinay Thomas, Chandler, AZ (US); Michael Coulter, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 377 days.

(21) Appl. No.: 12/785,946

(22) Filed: May 24, 2010

(65) Prior Publication Data
US 2011/0286528 A1  Nov. 24, 2011

(51) Int. Cl.
*H04N 7/12* (2006.01)
*H03M 7/40* (2006.01)
*H04N 9/877* (2006.01)

(52) U.S. Cl.
CPC .............. *H03M 7/40* (2013.01); *H04N 9/877* (2013.01)
USPC .................................................. 375/240.24

(58) Field of Classification Search
USPC .......................................... 375/240.01, 240.25
See application file for complete search history.

(56) References Cited

U.S. PATENT DOCUMENTS

| | | | |
|---|---|---|---|
| 4,660,078 A * | 4/1987 | Riolfo et al. | 375/240.03 |
| 5,561,464 A * | 10/1996 | Park | 375/240.1 |
| 5,978,507 A | 11/1999 | Shackleton et al. | |
| 5,978,509 A * | 11/1999 | Nachtergaele et al. | 382/236 |
| 6,105,114 A | 8/2000 | Okuno | |
| 6,272,180 B1 * | 8/2001 | Lei | 375/240.16 |
| 6,304,607 B1 | 10/2001 | Talluri et al. | |
| 6,353,633 B1 * | 3/2002 | Her | 375/240.18 |
| 6,567,562 B1 | 5/2003 | Nakayama et al. | |
| 6,650,784 B2 | 11/2003 | Thyagarajan | |
| 6,668,094 B1 | 12/2003 | Yoo et al. | |
| 6,711,295 B2 | 3/2004 | Nakayama et al. | |
| 6,785,425 B1 | 8/2004 | Feder et al. | |
| 7,626,518 B2 * | 12/2009 | Hussain et al. | 341/51 |
| 8,134,885 B2 * | 3/2012 | Feng | 365/230.08 |
| 2004/0008896 A1 | 1/2004 | Suzuki | |
| 2005/0185568 A1 * | 8/2005 | Davidson | 369/126 |
| 2005/0229061 A1 | 10/2005 | Kang et al. | |
| 2006/0104530 A1 * | 5/2006 | Smirnov | 382/245 |

(Continued)

FOREIGN PATENT DOCUMENTS

CN  1550108 A  11/2004
EP  0734164 A2  9/1996

(Continued)

OTHER PUBLICATIONS

Golomb, S. W. "Run-Length Encodings," IEEE Transactions of Information Theory, vol. 12, Jul. 1966, pp. 399-401.

(Continued)

*Primary Examiner* — Dave Czekaj
*Assistant Examiner* — Tracy Li
(74) *Attorney, Agent, or Firm* — Glen B Choi (57) ABSTRACT

Techniques are described that can be used to store macroblocks to memory and retrieve macroblocks from memory. In some cases, macroblocks can be stored in memory in memory addressable locations with column and row addresses flipped. Because macroblocks are stored in columns but retrieved across rows, portions of multiple macroblocks can be retrieved in a single read burst. The portions can be Golomb decoded and stored so that macroblocks can be re-assembled from the portions. In some cases, macroblocks of encoded video can be stored in continuous memory addressable locations.

16 Claims, 7 Drawing Sheets

(56) References Cited

U.S. PATENT DOCUMENTS

| | | | |
|---|---|---|---|
| 2007/0110151 A1* | 5/2007 | Yu et al. | 375/240.03 |
| 2007/0297501 A1 | 12/2007 | Hussain et al. | |
| 2008/0089412 A1* | 4/2008 | Ugur et al. | 375/240.12 |
| 2008/0122664 A1 | 5/2008 | Chang et al. | |
| 2008/0247641 A1* | 10/2008 | Rasmusson et al. | 382/166 |
| 2009/0254694 A1 | 10/2009 | Ehrman et al. | |
| 2010/0085218 A1 | 4/2010 | Monro | |

FOREIGN PATENT DOCUMENTS

| | | |
|---|---|---|
| EP | 0838956 A2 | 4/1998 |
| WO | 2011/149751 A2 | 12/2011 |
| WO | 2011/162964 A2 | 12/2011 |
| WO | 2011/149751 A3 | 4/2012 |
| WO | 2011/162964 A3 | 4/2012 |

OTHER PUBLICATIONS

Office Action received for United Kingdom Patent Application No. GB1108465.4, mailed on Aug. 25, 2011, 5 pages.

International Search Report and Written Opinion received for PCT Application No. PCT/US2011/037104, Mailed on Dec. 7, 2011, 9 pages.

Office Action received for Chinese Patent Application No. 201110135358.1, mailed on May 22, 2013, 8 pages of Chinese office action and 9 pages of English Translation.

Office Action received for United Kingdom Patent Application No. GB1108465.4, mailed on Jun. 26, 2013, 3 pages.

Office Action received for Chinese Patent Application No. 201110188590.1, mailed on Feb. 5, 2013, 7 pages of Chinese office action and 9 pages of English Translation.

International Preliminary Report on Patentability Received for PCT Application No. PCT/US2011/037104, Mailed on Dec. 6, 2012, 8 pages.

International Preliminary Report on Patentability Received for PCT Application No. PCT/US2011/039716, Mailed on Jan. 10, 2013, 7 pages.

International Search Report and Written Opinion received for PCT Application No. PCT/US2011/039716, Mailed on Feb. 24, 2012, 10 pages.

Office Action received for U.S. Appl. No. 12/823,637, mailed on Nov. 19.2012, 9 pages.

Office Action received for U.S. Appl. No. 12/823,637, mailed on Sep. 4, 2012, 12 pages.

Office Action received for U.S. Appl. No. 12/823,637, mailed on Feb. 6, 2013, 11 pages.

Office Action received for U.S. Appl. No. 12/823,637, mailed on Oct. 18, 2012, 13 pages.

Office Action received for United Kingdom Patent Application No. GB1108465.4, mailed on Apr. 16, 2014, 2 pages.

Office Action received for Chinese Patent Application No. 201110188590.1, mailed on Sep. 30, 2013, 5 pages of Chinese Office Action and 6 pages of English Translation.

* cited by examiner

TECHNIQUES FOR STORING AND RETRIEVING PIXEL DATA

RELATED APPLICATIONS

This application is related to U.S. patent application Ser. No. 12/823,637, entitled "System, Method, and Computer Program Product for Parameter Estimation for Lossless Video Compression," filed Jun. 25, 2010.

FIELD

The subject matter disclosed herein relates generally to techniques for storing and retrieving pixel data.

RELATED ART

Some video encoders and decoders integrated into systems on chip (SoC) devices write video data into a memory and fetch video data from memory for motion vector generation and motion compensation. Motion vector generator and motion compensation are well known techniques in video encoding and decoding. Writing and reading from external memory can consume significant amounts of power. As video frame size increases in consumer electronics devices, it is desirable to reduce the number of read and operations from memory and write operations to memory. Reducing the number of reads and writes from memory can reduce power consumption and potentially free memory for use by devices other than video encoders and decoders.

BRIEF DESCRIPTION OF THE DRAWINGS

Embodiments of the present invention are illustrated by way of example, and not by way of limitation, in the drawings and in which like reference numerals refer to similar elements.

DETAILED DESCRIPTION

Reference throughout this specification to "one embodiment" or "an embodiment" means that a particular feature, structure, or characteristic described in connection with the embodiment is included in at least one embodiment of the present invention. Thus, the appearances of the phrase "in one embodiment" or "an embodiment" in various places throughout this specification are not necessarily all referring to the same embodiment. Furthermore, the particular features, structures, or characteristics may be combined in one or more embodiments.

Various embodiments potentially reduce the number of write and read operations used to respectively write and read reference pictures. Some embodiments attempt to losslessly compress the reference pictures and store compressed reference pictures into memory for use by either a video encoder or a video decoder. For pictures that are requested to be stored by a video decoder, a flipped addressing scheme is used whereby column addresses are made row addresses and vice versa. The compressed pictures are stored into memory according to the flipped memory addressing scheme.

To retrieve the reference picture stored in the flipped configuration from memory, one or more rows of reference picture data can be read and decompressed. Decompressed reference picture data can be stored into memory. When compressed reference picture data are stored in columns but read in rows, portions of multiple rows of reference pictures can be retrieved. Portions of multiple rows of reference pictures can be stored in a memory and reassembled for the video decoder. In some cases, if a particular pixel from a reference picture is requested by the video decoder, reads of portions of multiple rows of reference pictures occur until the requested pixel (or pixels) is identified. One or more burst sizes worth of data may be retrieved to retrieve a requested pixel. If additional pixels of data have been read, the additional pixels of data can be stored in memory potentially for future use.

For pictures that are requested to be stored by a video encoder, compressed data is stored in an unrolled manner whereby the compressed data is stored in contiguous memory addressable locations. In some cases, video encoders request entire macroblocks of data. Accordingly, when a video encoder requests retrieval of a reference macroblocks, compressed entire macroblocks of data are requested to be retrieved from contiguous memory locations in one or more read bursts.

Figure 1:
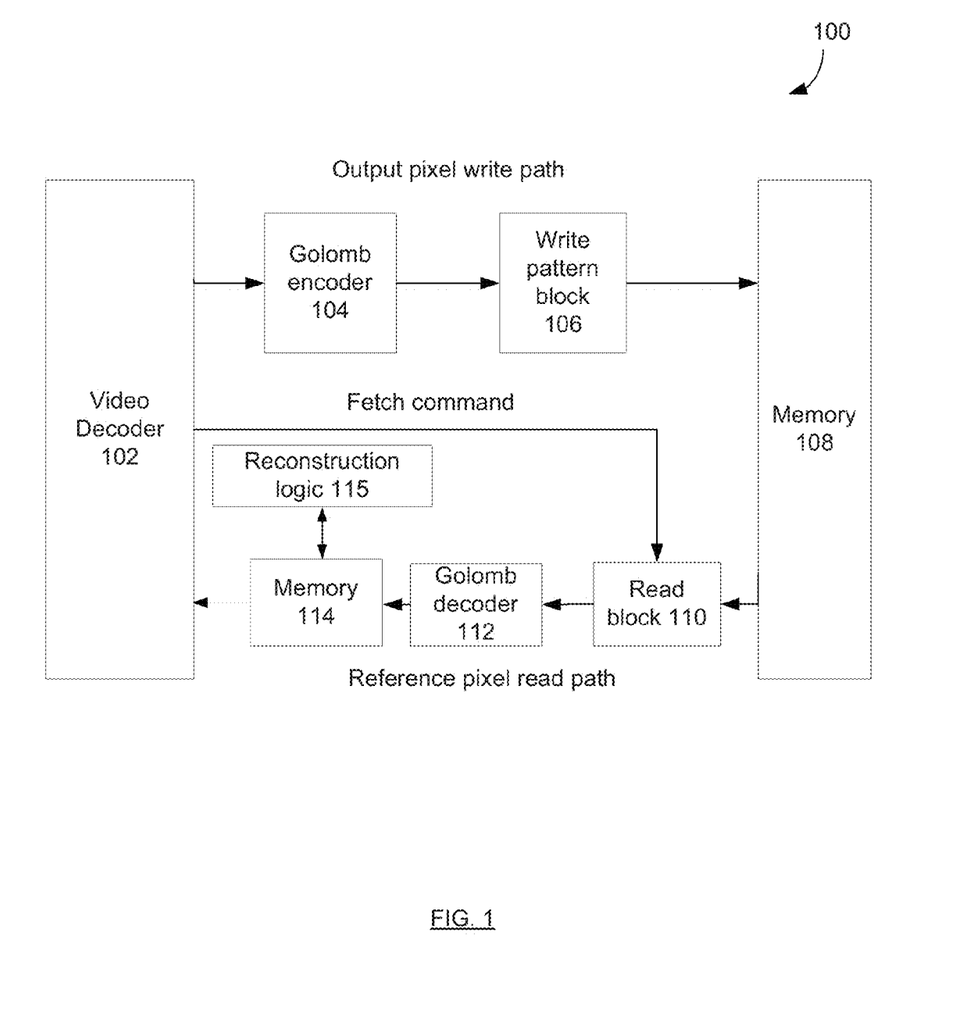
FIG. 1 depicts an example of a video decoding system.

FIG. 1 shows a block diagram of a system in which a video decoder system writes macroblocks into memory and retrieves macroblocks from memory. Video decoder 102 is to perform video decoding on received frames. Video decoder 102 can apply any video decoding standard to decode macroblocks such as but not limited to MPEG-2 (ISO/IEC 13818-1 (2000)), MPEG-4, part 10 (ISO/IEC 14496-10 (2009)), as well as evolving video decoding standards such as ITU-T H.265. Decoded macroblocks can be used as a reference for decoding another macroblock.

Golomb encoder 104 is to receive macroblocks from video decoder 102. Golomb encoder 104 is to perform Golomb compression of macroblocks. Golomb encoding is described in Golomb, S. W., "Run-length Encodings," IEEE Transactions on Information Theory, IT (1966). Golomb encoding approaches the compression capabilities of Huffman codes as the frame size increases. Compressing decoded images prior to storage into memory can potentially reduce the number of write operations of decoded images into memory. In some cases, 4 symbol Golomb encodes and decodes can occur per clock cycle. By contrast, other lossless compression schemes may achieve compression of one symbol per multiple clock cycles.

Techniques for performing Golomb encoding are described in U.S. patent application Ser. No. 12/823,637, entitled "System, Method, and Computer Program Product for Parameter Estimation for Lossless Video Compression," inventors Thomas and Coulter, filed Jun. 25, 2010. In some cases, a strong correlation between adjacent frames can occur. In various embodiments, for Golomb encoding, a histogram of the previous frame's symbols is generated to predict the number of bits in the current frame after lossless compression assuming a specific coding parameter. Iterating through all of the possible coding parameters on the previous frame histogram may yield an optimal coding parameter with which the current frame can be compressed. Using the previous frame as a predictor can result in high compression efficiency. An example process of a Golomb-Rice compression scheme is as follows:

1. Generate a histogram of the previous frames symbols based upon a chosen coding parameter, i.e., M=0 for Golomb. A symbol is the error value pixel(n)−pixel(n−1).
2. Sort the histogram in descending order.
3. Assign a Golomb code to each bin. A bin in a histogram is each separate symbol or range of symbols for which there is a count maintained. For example, for pixels that have values from 0-255, 0 could be a first bin, 1 could be the next bin, and so forth. In another example, there could be several bins, with each bin covering a range of pixel values. Each of these bins has an associated count of the number of times the values within the range of each bin has occurred.
4. Multiply the number of entries in a bin by its assigned Golomb code for each bin.
5. The sum of these products will yield an estimate of the number of bits required to code the current frame for a specific coding parameter.
6. Repeat items 1-5 for each coding parameter and select the coding parameter that yields the fewest number of total bits. For example, in an 8-bit pixel example using Golomb coding, there can be 8 coding parameters to select from, i.e., M=0 through M=7.

Golomb encoder 104 compresses each row of a macroblock and requests writing of the compressed rows into memory in a flipped formation. In some cases, Golomb encoder 104 requests that the left-most compressed column of each flipped macroblock be stored at a known address and then the remaining compressed columns be stored afterward. Thereafter, read block 110 is able to randomly access the beginning of each macroblock by randomly accessing the left-most compressed column. Read block 110 reads the remainder of each compressed macroblock after the first compressed column. In some cases, Golomb encoder 104 requests that a left-most compressed column of each flipped macroblock be stored at every $128^{th}$ column of memory. This allows random access of the beginning of every eighth compressed macroblock. Other manners of storing macroblocks are permissible provided that the beginning of some macroblocks are randomly accessible.

Golomb encoder 104 is to provide lossless compressed images to write pattern block 106. Write pattern block 106 is to write Golomb compressed macroblocks into memory 108 in a manner described with regard to FIG. 2B. In some embodiments, write pattern block 106 is to write compressed images into memory 108 by writing rows of pixels as columns of pixels instead of as rows. In other words, row and column memory addresses can be reversed so that row addresses are used as column addresses and vice versa. Memory 108 can be a double data rate (DDR) type memory, although other types of external memory with a minimum read burst size can be used. In some cases, memory 108 is formed within the same integrated circuit as video decoder 102. In other cases, memory 108 is part of a separate integrated circuit from video decoder 102.

In some cases, writing compressed pictures using the flipped addressing scheme can use fewer write operations than writing compressed pictures across rows. For some memories, such as DDR, write operations take place in 32 byte increments. Writing compressed macroblocks in flipped configuration can reduce filler content written to memory.

One example of compression and storage of decoded macroblocks is as follows. In some implementations, eight (8) decoded macroblocks can be buffered and compressed using Golomb encoding. As a result of compression, sixteen (16) rows of data are available. Each row of data can be doubled so that the number of rows becomes thirty two (32). For example, each row of data can be re-written so that each row includes two rows of data and the number of columns is reduced. For example, a 128 byte line compressed to 64 bytes can be saved as 2 rows of 32 bytes. Thereafter, the data is stored into memory by reversing row and column addresses.

Read block 110 is to read compressed macroblocks from memory 108. Video decoder 102 may request read block 110 to read a particular macroblock or particular pixel from memory 108. Compressed macroblocks are stored in a manner described with regard to FIG. 2B. Compressed macroblocks are stored with row and column addresses reversed but retrievals from memory may take place across rows. In some embodiments, read block 110 reads compressed macroblocks from memory 108 using read bursts across rows and provides portions of each column to Golomb decoder 112. Read block 110 is able to directly access any column position within a row. For each read burst after the first read burst, read block 110 recalls the last directly accessible column position is for a row and calculates the address to go to the last directly accessible location and starts from there. A pixel that is to be accessed is accessed by accessing at least one column of compressed data that includes the pixel that is to be accessed.

Writing macroblocks in a flipped configuration can potentially reduce a number of read operations when the macroblocks are subsequently retrieved from memory. If compressed data columns are similar in length, read bursts with filler, i.e., non-compressed data, are reduced. Retrieved portions of macroblocks are stored in a cache and those retrieved portions can be reconstructed as macroblocks or stored for future use.

Figure 2A:
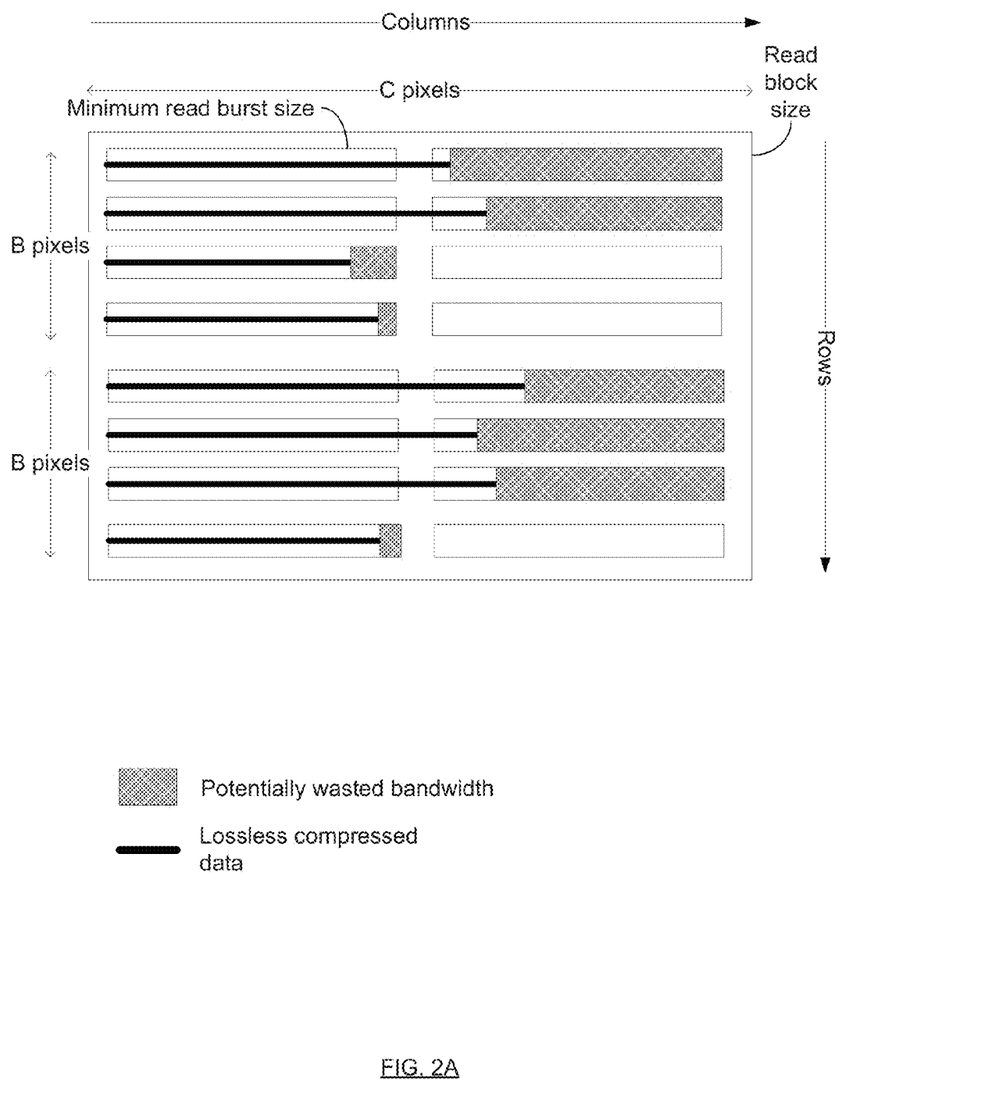
FIG. 2A shows several examples in which pixels are read from memory in bursts along rows of memory locations.

In cases, where one or more compressed macroblocks is substantially longer than the other compressed macroblocks, then the scheme of FIG. 2A can be used. In some case, Golomb encoder 104 detects that a compressed macroblock causes more read and write inefficiency than if stored uncompressed and in such case, Golomb encoder 104 can request to store the macroblock uncompressed in memory.

Golomb decoder 112 is to perform Golomb decoding on each retrieved compressed data from memory 108. Golomb decoding is described in Golomb, S. W., "Run-length Encodings," IEEE Transactions on Information Theory, IT (1966). Golomb decoder 112 is to provide decoded pixels to memory 114. Suitable techniques for performing Golomb decoding are described in U.S. patent application Ser. No. 12/823,637, entitled "System, Method, and Computer Program Product for Parameter Estimation for Lossless Video Compression," inventors Thomas and Coulter, filed Jun. 25, 2010.

Memory 114 stores Golomb decoded portions of macroblocks. In some embodiments, memory 114 is implemented as a cache, although other types of memory can be used to store portions of macroblocks. Video decoder 102 can request one or more pixels in a macroblock from memory 108. Reconstruction logic 115 determines whether memory 114 stores the macroblock or pixel requested by video decoder 102. The requested macroblock or pixel could be used as a reference macroblock or pixel in video decoding. Reconstruction logic 115 requests read block 110 to read a next row from memory 108 until the requested pixel is retrieved. In some cases, a single 32 byte DDR burst read retrieves 16 rows from memory 108, starting at the last directly accessible column or last accessed location for that set of rows. A 32 byte read burst can translate to 32 rows, which can be made 16 rows by doubling each line.

The following is an example of a manner of retrieving pixels from a memory when the pixels are used by a decoder. Data are stored in flipped format with column and row addresses reversed. Sixteen (16) rows of data are fetched. If the requested pixels are not stored in memory, then additional row reads take place starting at the last directly accessible column or starting after the previously accessed location of a set of retrieved rows. The read data is Golomb decompressed. If the requested number of pixel columns are included in the latest fetch such that the requested pixels are included in the latest fetch, then no additional reads are performed. In addition, if the requested pixels are included in the latest fetch, then the last accessed address for each row is stored so that subsequent fetches do not read previously read data.

FIG. 2A shows several examples in which pixels are read from memory in bursts along rows of memory locations. In this example, blocks are stored along rows. Solid strips represent blocks stored as compressed data. Each macroblock is C pixels by B pixels. A minimum size of each read burst is shown as a rectangle. In some cases, the minimum read burst is 32 bytes. When more than one read burst is used to capture compressed data of a block, some of the data read in the second read burst is not part of the compressed data. Accordingly, data that is not part of the compressed data can be considered wasted bandwidth.

Figure 2B:
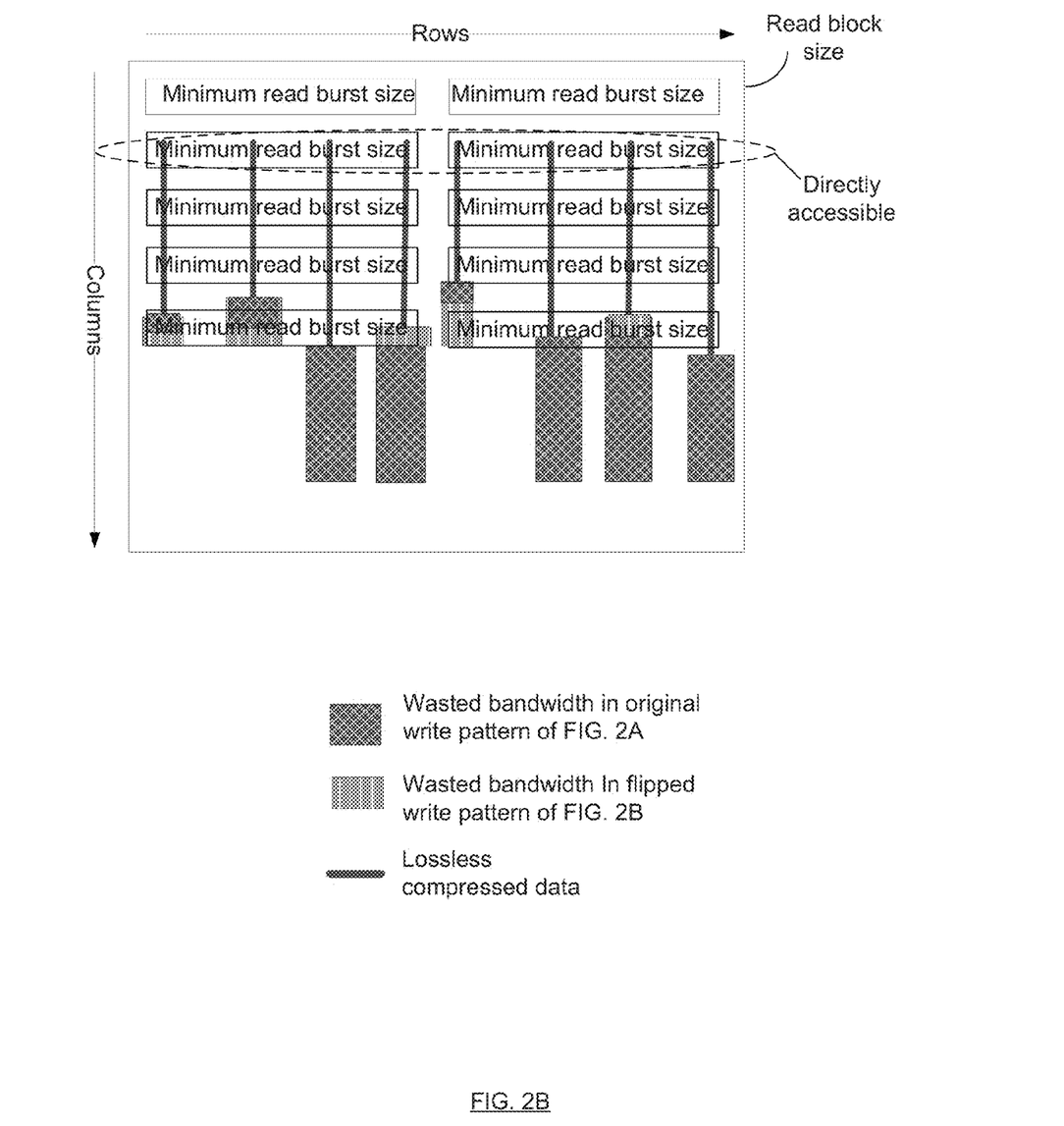
FIG. 2B depicts a manner in which compressed data are stored and retrieved from memory when compressed data is stored with column and row addresses reversed.

FIG. 2B depicts a manner in which compressed data are stored and retrieved from memory when compressed data is stored with column and row addresses reversed. A solid line represents a line of compressed pixels in a macroblock. In some cases, beginnings of each column of compressed data can be accessed as opposed to the middle or end of the column. Read bursts occur across a row of memory addresses, with increasing column memory addresses. Because each compressed macroblock is stored in a column, a portion of at least one column of stored compressed data is retrieved in each read burst. Portions of each column of a compressed macroblock can be decompressed, stored, and later reassembled as an uncompressed macroblock.

FIG. 2B also depicts a comparison between retrieved data that is not part of compressed data when data is stored and retrieved in rows (FIG. 2A) as opposed to columns (FIG. 2B). By comparison, compressed data is retrieved using fewer read bursts when data are stored and retrieved using techniques of FIG. 2B as opposed to the techniques of FIG. 2A.

Figure 3:
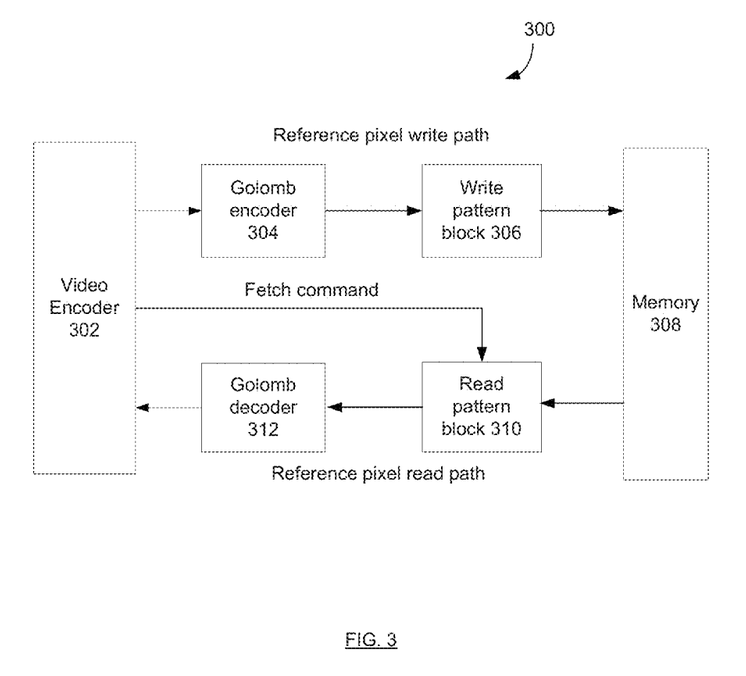
FIG. 3 depicts an example of a video encoder system according to an embodiment.

FIG. 3 depicts an example of a video encoder system according to an embodiment. Video encoder 302 is to perform video encoding on blocks of a picture. Any video encoding standards can be used such as but not limited to MPEG-2 (ISO/IEC 13818-1 (2000)), MPEG-4, part 10 (ISO/IEC 14496-10 (2009)), as well as evolving video decoding standards such as ITU-T H.265. Video encoder 302 is to provide encoded macroblocks to Golomb encoder 304. Golomb encoder 304 is to perform Golomb encoding on encoded macroblocks. Golomb encoder 304 can use similar techniques as Golomb encoder 104 to perform Golomb compression. Golomb encoder 304 is to output compressed raw YUV data.

Figure 4A:
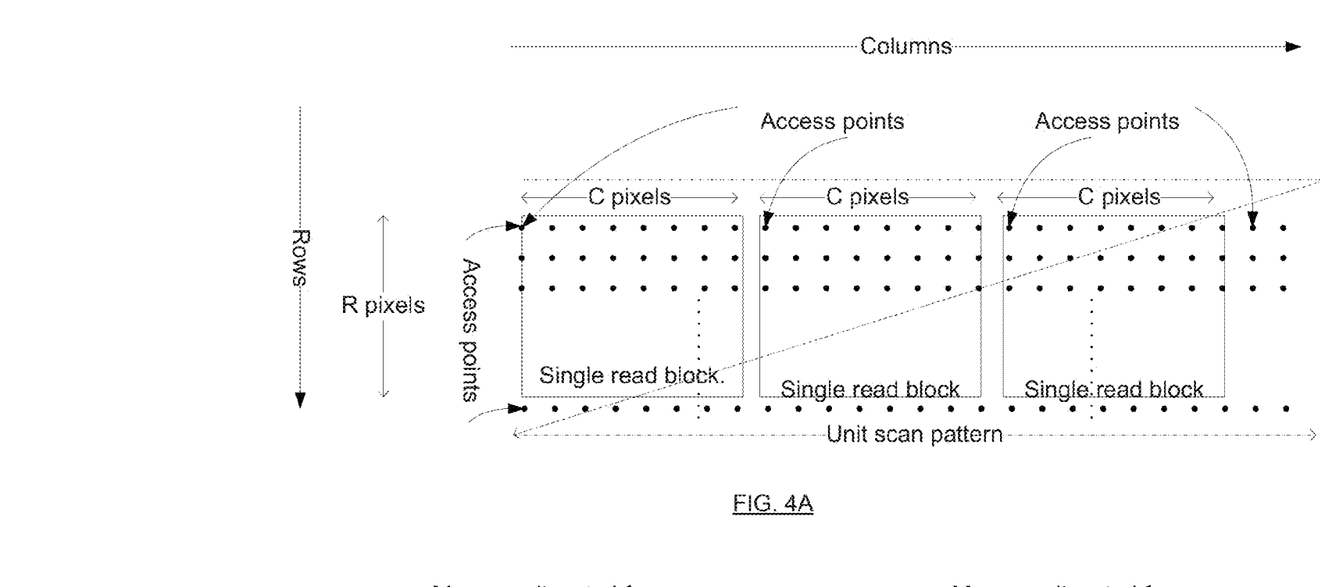
FIG. 4A depicts a manner to write and read macro-blocks in a conventional manner.
Figure 4B:
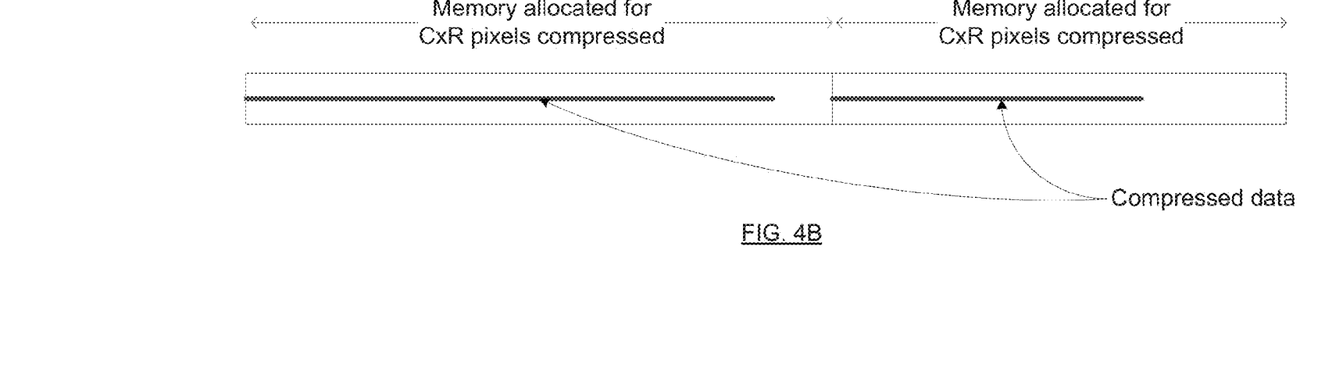
FIG. 4B depicts a manner to write and read macro-blocks in an unrolled manner.

Write pattern block 306 is to write Golomb encoded macroblocks into memory 308 in a manner described with regard to FIG. 4B. In some embodiments, write pattern block 306 is to write compressed data into memory 308 as continuous memory addressable locations. In some cases, memory 308 is formed within the same integrated circuit as video encoder 302. In other cases, memory 308 is part of a separate integrated circuit from video encoder 302.

Read pattern block 310 is to read encoded data from memory 308 by requesting reads of contiguous memory locations until a macroblock requested by video encoder 302 is read. Golomb decoder 312 is to apply Golomb decoding on the compressed YUV data using similar techniques as described with regard to Golomb decoder 112. Golomb decoder 312 is to provide macroblocks to video encoder 302.

FIG. 4A depicts a manner to write macro-blocks in a conventional manner. In a conventional manner, pixels of a macro-block are written-to and read-out from memory in a zig-zag manner. For a macro block that is C by R pixels in dimension, pixels are read starting at an access point across a row of the macro block and then across a row of the next macro block.

FIG. 4B depicts a manner to write macro-blocks in an unrolled manner. In this example, C by R pixels of a macro block are stored and retrieved in memory in continuous memory addressable locations as opposed to in a macro block structure of FIG. 4A. Multiple read bursts can be used to read the compressed macroblock requested by video encoder 302. FIG. 4B depicts that compressed macroblocks may not span an entire read burst worth of data. Accordingly, some retrieved data may not contain useful data. Read pattern block 310 retrieves the top left pixel of the compressed macroblock and then continues reading until all of the compressed macroblock is retrieved. Golomb encoder 104 can request storage of the beginning of each macroblock in locations that are directly accessible by read pattern block 310.

For a flipped configuration, if any compressed line is particularly longer than other compressed lines, then there is potentially waste when reading the portion of the compressed line because data read in a read burst to retrieve the tail end of a line includes mostly non-useful data. By contrast, with the unrolled configuration, while providing row random access, there is no wasted bandwidth in any read except potentially in the last read, where filler material can be read. Read bursts of 32 bytes of contiguous pixels continue until retrieval of entire desired macroblock takes place. For a 16×16 unrolled macroblock that is not compressed, 16 columns and 2 rows are read in a single read burst.

Figure 5:
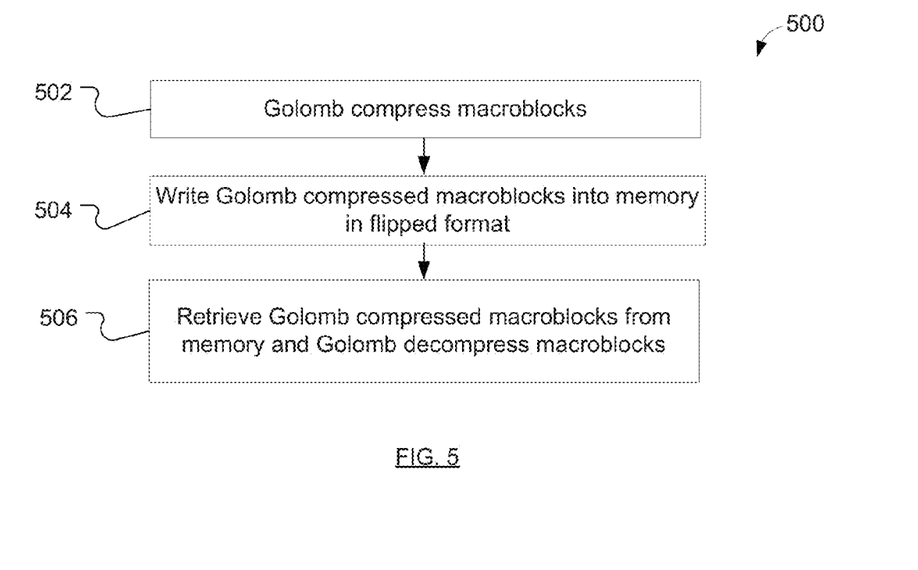
FIG. 5 depicts an example process used by a video decoding system to store and retrieve macroblocks.

FIG. 5 depicts an example process used by a video decoding system to store and retrieve macroblocks.

Block 502 includes Golomb compressing macroblocks.

Block 504 includes writing Golomb compressed macroblocks into memory addressable locations by using column addresses as row addresses and vice versa. For example, techniques described with regard to FIG. 2B can be used for storing macroblocks into memory.

Block 506 includes retrieving Golomb compressed macroblocks from memory and Golomb decompressing the macroblocks. Portions of memory can be accessed using read bursts across the same row memory address and spanning multiple columns. Because macroblocks are stored in columns but retrieved across rows, portions of multiple macroblocks can be retrieved in a single read burst. The portions can be Golomb decoded and stored so that macroblocks can be re-assembled from the portions. Thereafter, a pixel or macroblock is available for the video decoder.

Figure 6:
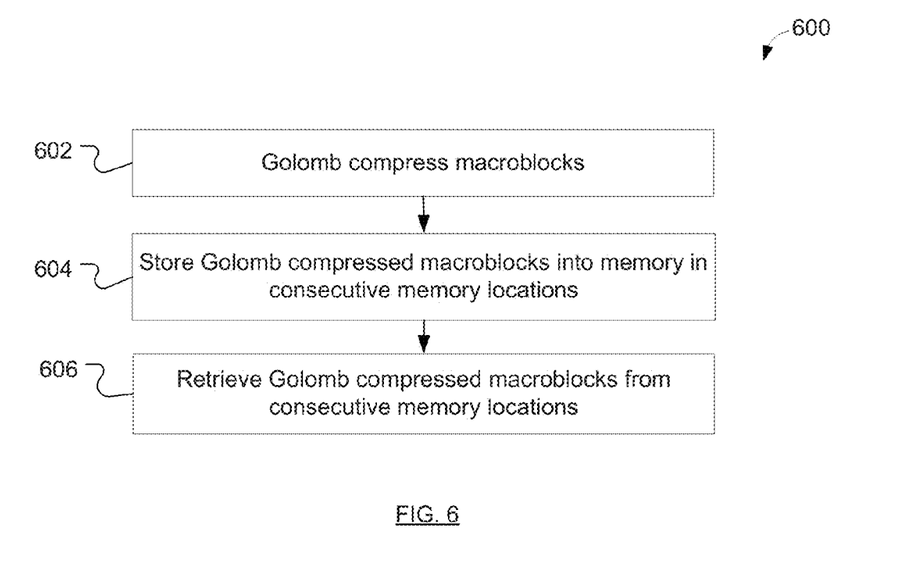
FIG. 6 depicts an example process used by a video encoding system.

FIG. 6 depicts an example process used by a video encoding system.

Block 602 includes applying Golomb compression to macroblocks that have been encoded according to a video standard.

Block 604 includes storing Golomb compressed macroblocks into memory in consecutive memory locations. For example, macroblocks are stored in memory in continuous memory addressable locations.

Block 606 includes retrieving stored Golomb compressed macroblocks from memory from consecutive memory addressable locations. One or more read bursts may take place to retrieve Golomb compressed macroblocks from memory.

Figure 7:
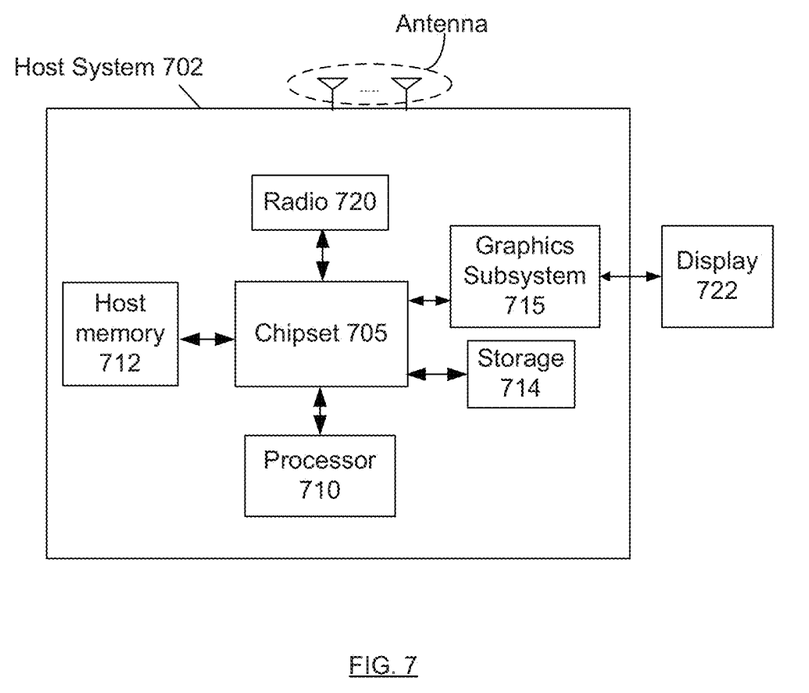
FIG. 7 depicts a system in accordance with an embodiment.

FIG. 7 depicts a system in accordance with an embodiment. System 700 may include host system 702 and display 722. Computer system 700 can be implemented in a handheld personal computer, mobile telephone, set top box, or any computing device. Host system 702 may include chipset 705, processor 710, host memory 712, storage 714, graphics subsystem 715, and radio 720. Chipset 705 may provide intercommunication among processor 710, host memory 712, storage 714, graphics subsystem 715, and radio 720. For example, chipset 705 may include a storage adapter (not depicted) capable of providing intercommunication with storage 714. For example, the storage adapter may be capable of communicating with storage 714 in conformance with any of the following protocols: Small Computer Systems Interface (SCSI), Fibre Channel (FC), and/or Serial Advanced Technology Attachment (S-ATA).

In various embodiments, storage and retrieval of decoded or encoded video into memory occur in accordance with techniques described herein.

Processor 710 may be implemented as Complex Instruction Set Computer (CISC) or Reduced Instruction Set Computer (RISC) processors, multi-core, or any other microprocessor or central processing unit.

Host memory 712 may be implemented as a volatile memory device such as but not limited to a Random Access Memory (RAM), Dynamic Random Access Memory (DRAM), or Static RAM (SRAM). Storage 714 may be implemented as a non-volatile storage device such as but not limited to a magnetic disk drive, optical disk drive, tape drive, an internal storage device, an attached storage device, flash memory, battery backed-up SDRAM (synchronous DRAM), and/or a network accessible storage device.

Graphics subsystem 715 may perform processing of images such as still or video for display. An analog or digital interface may be used to communicatively couple graphics subsystem 715 and display 722. For example, the interface may be any of a High-Definition Multimedia Interface, DisplayPort, wireless HDMI, and/or wireless HD compliant techniques. Graphics subsystem 715 could be integrated into processor 710 or chipset 705. Graphics subsystem 715 could be a stand-alone card communicatively coupled to chipset 705.

Radio 720 may include one or more radios capable of transmitting and receiving signals in accordance with applicable wireless standards such as but not limited to any version of IEEE 802.11 and IEEE 802.16.

Although not depicted, system 700 can include access to input devices such as a touch screen, mouse, and camera.

The graphics and/or video processing techniques described herein may be implemented in various hardware architectures. For example, graphics and/or video functionality may be integrated within a chipset. Alternatively, a discrete graphics and/or video processor may be used. As still another embodiment, the graphics and/or video functions may be implemented by a general purpose processor, including a multi-core processor. In a further embodiment, the functions may be implemented in a consumer electronics device.

Embodiments of the present invention may be implemented as any or a combination of: one or more microchips or integrated circuits interconnected using a motherboard, hardwired logic, software stored by a memory device and executed by a microprocessor, firmware, an application specific integrated circuit (ASIC), and/or a field programmable gate array (FPGA). The term "logic" may include, by way of example, software or hardware and/or combinations of software and hardware.

Embodiments of the present invention may be provided, for example, as a computer program product which may include one or more machine-readable media having stored thereon machine-executable instructions that, when executed by one or more machines such as a computer, network of computers, or other electronic devices, may result in the one or more machines carrying out operations in accordance with embodiments of the present invention. A machine-readable medium may include, but is not limited to, floppy diskettes, optical disks, CD-ROMs (Compact Disc-Read Only Memories), magneto-optical disks, ROMs (Read Only Memories), RAMs (Random Access Memories), EPROMs (Erasable Programmable Read Only Memories), EEPROMs (Electrically Erasable Programmable Read Only Memories), magnetic or optical cards, flash memory, or other type of media/machine-readable medium suitable for storing machine-executable instructions.

The drawings and the forgoing description gave examples of the present invention. Although depicted as a number of disparate functional items, those skilled in the art will appreciate that one or more of such elements may well be combined into single functional elements. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A computer-implemented method comprising:
performing Golomb compression on image data;
selecting a first or second configuration to store Golomb compressed image data into memory, the selecting based in part on whether the image data is requested to be stored by a video decoder or video encoder, wherein:
the first configuration comprises reversal of row and column memory addresses,
the second configuration comprises storage of compressed image data into consecutive locations of the memory,
selecting the first configuration occurs in response to a request to store the image data provided by the video decoder, and
selecting the second configuration occurs in response to a request to store the image data provided by the video encoder; and
initiating storing of the Golomb compressed image data into the memory in the selected one of first or second configurations.

2. The method of claim 1, wherein:
the image data comprises a macro block,
performing Golomb compression on image data comprises performing Golomb compression on each row of the macroblock,
when the compressed image data is stored in the first configuration, each compressed row of the macroblock is stored in a column, and
when the compressed image data is stored in the second configuration, compressed rows of the macroblock are stored in consecutive locations.

3. The method of claim 1, further comprising:
requesting retrieval of image data from the memory;
performing Golomb decompression on the retrieved image data; and
selectively transferring the decompressed image data to the video decoder or encoder in response to the decompressed image data including image data having been requested by the video decoder or encoder.

4. The method of claim 3, further comprising:
in response to a request from the video decoder for a pixel, determining whether the retrieved data includes the requested pixel and
requesting another data read from the memory in response to the retrieved data not including the requested pixel.

5. The method of claim 4, further comprising:
performing Golomb decompression on retrieved image data from the another data read;
storing decompressed retrieved data into a second memory; and
providing stored decompressed retrieved data to the video decoder.

6. The method of claim 3, wherein requesting retrieval of image data from the memory comprises requesting retrieval of image data by reading one or more rows of data in response to the image data having been requested by the video decoder, wherein each retrieved row includes portions of multiple stored compressed image data.

7. The method of claim 3, wherein requesting retrieval of image data from the memory comprises requesting retrieval of image data from consecutive memory locations in response to the image data having been requested by the video encoder.

8. An apparatus comprising:
an image source to provide image data;
Golomb compression logic to apply Golomb compression to the image data;
a memory; and
write logic to write the compressed image data into the memory in either a first or second configuration, wherein
the first configuration comprises reversal of row and column addresses of the memory,
the second configuration comprises storage of compressed image data into consecutive locations of the memory,
the write logic is to write the compressed image data into the memory in the first configuration in response to a request to write the image data from the video decoder, and
the write logic is to write the compressed image data into the memory in the second configuration in response to a request to write the image data from the video encoder.

9. The apparatus of claim 8, wherein the image source comprises one of the video encoder or video decoder.

10. The apparatus of claim 8, further comprising:
read logic to retrieve stored image data from the memory, wherein the read logic is to retrieve stored image data in a manner based in part on whether the image data is requested by the video decoder or encoder and
a Golomb decoder to apply Golomb decoding to the retrieved stored image data.

11. The apparatus of claim 10, further comprising:
a second memory to store decoded retrieved stored image data and to provide decoded retrieved data to the video decoder in response to the decoded image data including image data requested by the video decoder and
reconstruction logic to determine whether the second memory includes requested image data, wherein the read logic is to request another data read from the memory in response to the retrieved data not including the requested image data.

12. The apparatus of claim 10, wherein the read logic is to read at least one row of addressable memory locations in response to the data being requested by the video decoder.

13. The apparatus of claim 10, wherein the read logic is to read consecutive addressable memory locations in response to the data being requested by the video encoder.

14. A system comprising:
a display device;
a radio interface; and
a video processing system communicatively coupled to the display device and the radio interface, the video processing system comprising:
one of a video encoder and a video decoder to provide image data,
Golomb compression logic to apply Golomb compression to the image data,
a memory,
write logic to write the compressed image data into the memory in either a first or second configuration, wherein
the first configuration comprises reversal of row and column addresses of the memory,
the second configuration comprises storage of compressed image data into consecutive locations of the memory,
the write logic is to store the compressed image data into the memory in the first configuration in response to a request to store the image data from the video decoder, and
the write logic is to store the compressed image data into the memory in the second configuration in response to a request to store the image data from the video encoder;
read logic to retrieve stored image data from the memory, wherein the read logic is to retrieve stored image data in a configuration based in part on whether the image data is requested by the video decoder or encoder,
a Golomb decoder to apply Golomb decoding to the retrieved stored image data,
a second memory to store decoded retrieved stored image data and to provide decoded retrieved stored image data to one of the video encoder or decoder in response to the decoded image data including image data requested by the video encoder or decoder, and
reconstruction logic to determine whether the second memory includes requested image data, wherein the read logic is to request another data read from the memory in response to the retrieved data not including the requested image data.

15. The system of claim 14, wherein the read logic is to read at least one row of addressable memory locations in response to the data being requested by the video decoder.

16. The system of claim 14, wherein the read logic is to read consecutive addressable memory locations in response to the data being requested by the video encoder.

* * * * *